United States Patent [19]
Nishi

[11] Patent Number: 5,539,497
[45] Date of Patent: Jul. 23, 1996

[54] PROJECTION EXPOSURE APPARATUS AND EXPOSURE METHOD

[75] Inventor: Kenji Nishi, Kawasaki, Japan

[73] Assignee: Nikon Corporation, Tokyo, Japan

[21] Appl. No.: 435,534

[22] Filed: May 5, 1995

Related U.S. Application Data

[63] Continuation of Ser. No. 973,613, Nov. 9, 1992, abandoned.

[30] Foreign Application Priority Data

Nov. 14, 1991 [JP] Japan ..................................... 3-326342

[51] Int. Cl.$^6$ .................................................. G03B 27/42
[52] U.S. Cl. .......................................................... 355/53
[58] Field of Search ........................ 355/52, 53; 356/400, 356/401

[56] References Cited

U.S. PATENT DOCUMENTS 4,595,282  6/1986  Takahashi ................................. 355/53

FOREIGN PATENT DOCUMENTS 63-108719  5/1988  Japan .

*Primary Examiner*—Khanh Dang
*Attorney, Agent, or Firm*—Shapiro and Shapiro

[57] ABSTRACT

A projection exposure apparatus and method for exposing a pattern on a mask onto a photosensitive substrate through a projection optical system comprises a two-dimensionally driven mask holding stage and a two-dimensionally driven substrate holding stage. Vibration sensors detect vibration of the mask and the projection optical system. A control device controls at least one of the mask holding stage and the substrate holding stage according to an output from at least one of the sensors so as to maintain a relative position between the mask and the substrate. The control device may memorize information regarding relative lateral shift and rotation of the mask and the substrate due to vibration, predict lateral shift and rotation on the basis of memorized information and information from vibration sensors, and employ the prediction in maintaining the relative position between the mask and the substrate. Exposure is performed so as to minimize the effects of vibration.

9 Claims, 4 Drawing Sheets

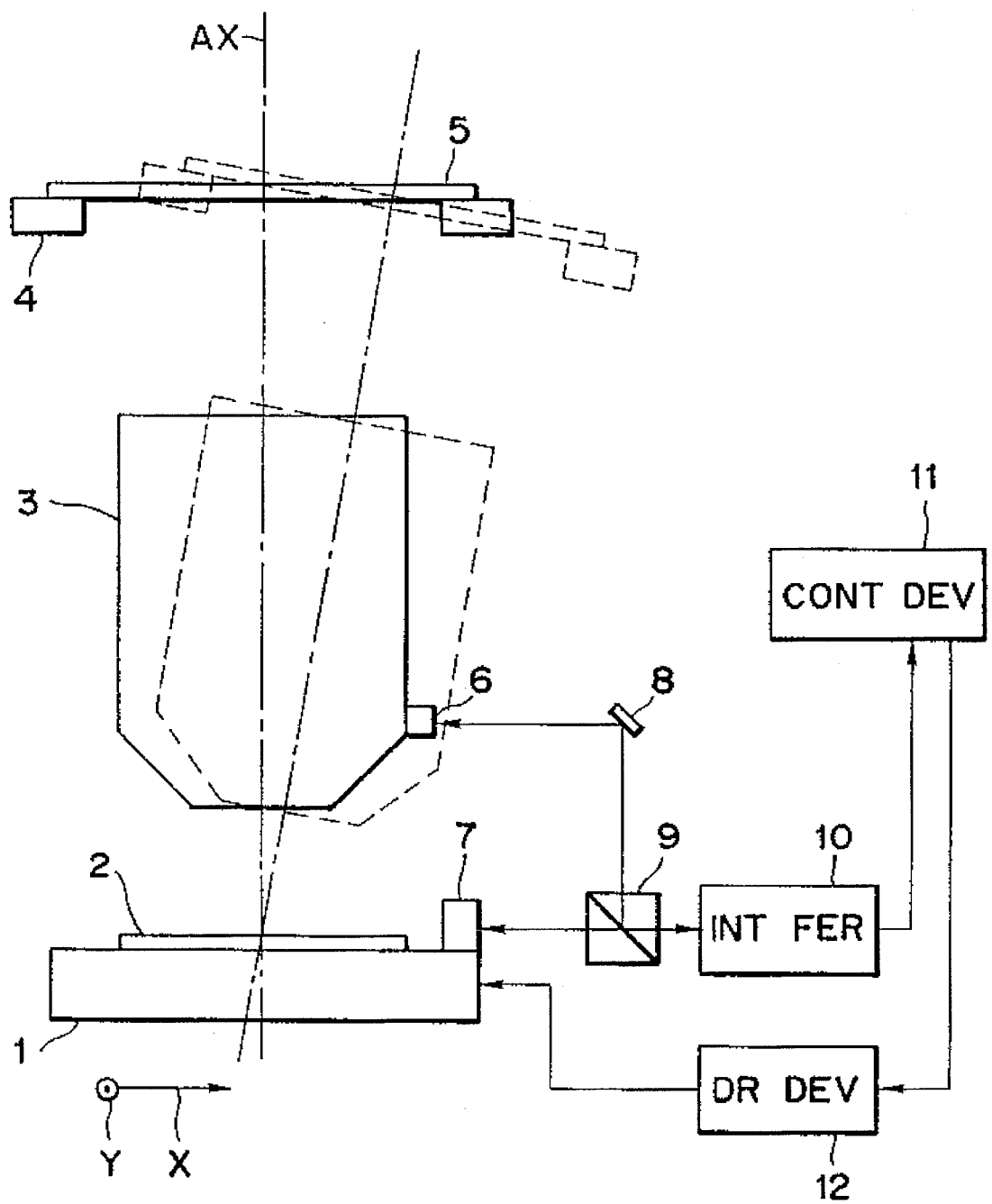

PROJECTION EXPOSURE APPARATUS AND EXPOSURE METHOD

This is a continuation of application Ser. No. 07/973,613 filed Nov. 9, 1992, now abandoned.

BACKGROUND OF THE INVENTION

1. Field of the Invention

The present invention relates to a projection exposure apparatus which is suitable to be applied to a projection exposure apparatus of a type in which a wafer stage is driven in a step-and-repeat method.

2. Related Background Art

A prior art projection exposure apparatus is shown in FIG. 4.

A photo-mask (hereinafter referred to as a reticle) 5 is supported by a reticle support member 4 and kept in a conjugate positional relation with a photo-sensitive substrate (hereinafter referred to as a wafer) 2 mounted on a wafer stage 1, through a projection lens 3.

A movable mirror 7 is attached to an end of the wafer stage 1 and it is moved as the wafer stage 1 is moved. A fixed mirror 6 is mounted in a lens barrel of the projection lens 3.

The movable mirror 7 reflects a laser beam directed from a laser beam interference range finder (interferometer) 10 through a beam splitter 9, and the fixed mirror 6 reflects a laser beam directed from the interferometer 10 through the beam splitter 9 and a reflection mirror 8. The interferometer 10 measures the reflected light from the movable mirror 7 and the fixed mirror 6 to detect a relative position of the movable mirror 7 and the fixed mirror 6.

A control unit 11 controls the drive of the wafer stage 1 to a desired position by a drive unit 12 in accordance with the relative position of the movable mirror 7 and the fixed mirror 6 detected by the interferometer 10.

In such a type of projection exposure apparatus, the reticle support member 4, the projection lens 3 and the wafer stage 1 are integrally coupled together by a predetermined support member (not shown). Thus, when the stage 1 is driven in X and Y directions, the entire apparatus is vibrated in such a direction that an optical axis AX is inclined around the wafer stage 1, as shown by a broken line in FIG. 4.

In this case, it has been considered that there is no positional shift of the reticle 5 and the wafer 2 because the relative position of the reticle 5, the projection lens 3 and the wafer 2 does not change like a pendulum.

However, because the wafer stage 1 is movable in X and Y directions, a center of gravity changes by the movement. When a vibration is generated, a rotation error component to the reticle 5 and the wafer stage 1 is included in a vibration component due to a twist of the entire apparatus or stage yawing. Further, a shift component or a rotation component to the reticle 5 and the wafer stage 1 is included in the vibration component due to a delay in transmission of the vibration and a difference between lateral shifts by the vibration between the fixed mirror 6 and the reticle 5. By the inclusion of the rotation error component and the shift component (or rotation component) in the vibration component, the relative position of the reticle 5 and the wafer 2 varies, which causes a stepping error. As a result, precise exposure is not attained.

SUMMARY OF THE INVENTION

It is an object of the present invention to keep a constant relative relation between a reticle and a wafer by detecting a change of a relative position between the reticle and the wafer and controlling a drive system and exposure timing.

It is another object of the present invention to provide a projection exposure apparatus and an exposure method which do not cause a lateral shift or a rotation error due to the vibration of the entire apparatus.

In the projection exposure apparatus of the present invention for exposing a pattern on a photo-mask onto a photo-sensitive substrate through a projection optical system, vibration detection means for detecting vibration around the photo-mask is provided in a vicinity of a support member which supports the photo-mask. During the exposure, drive means for the photo-mask and/or drive means for the photo-sensitive substrate are controlled or exposure means is controlled in accordance with a result of detection by the vibration detection means.

During the exposure, whether a vibration component detected by the vibration sensor causes a change in the relative relation between the reticle and the wafer or not is determined, and if it does, the reticle drive means and/or the wafer drive means are controlled or the exposure means is controlled to maintain the relative relation of the reticle and the wafer. In this manner, the relative position of the reticle and the wafer is kept unchanged during the exposure.

BRIEF DESCRIPTION OF THE DRAWINGS

FIG. 4 shows an overall configuration of a prior art projection exposure apparatus.

DETAILED DESCRIPTION OF THE PREFERRED EMBODIMENTS

Figure 1:
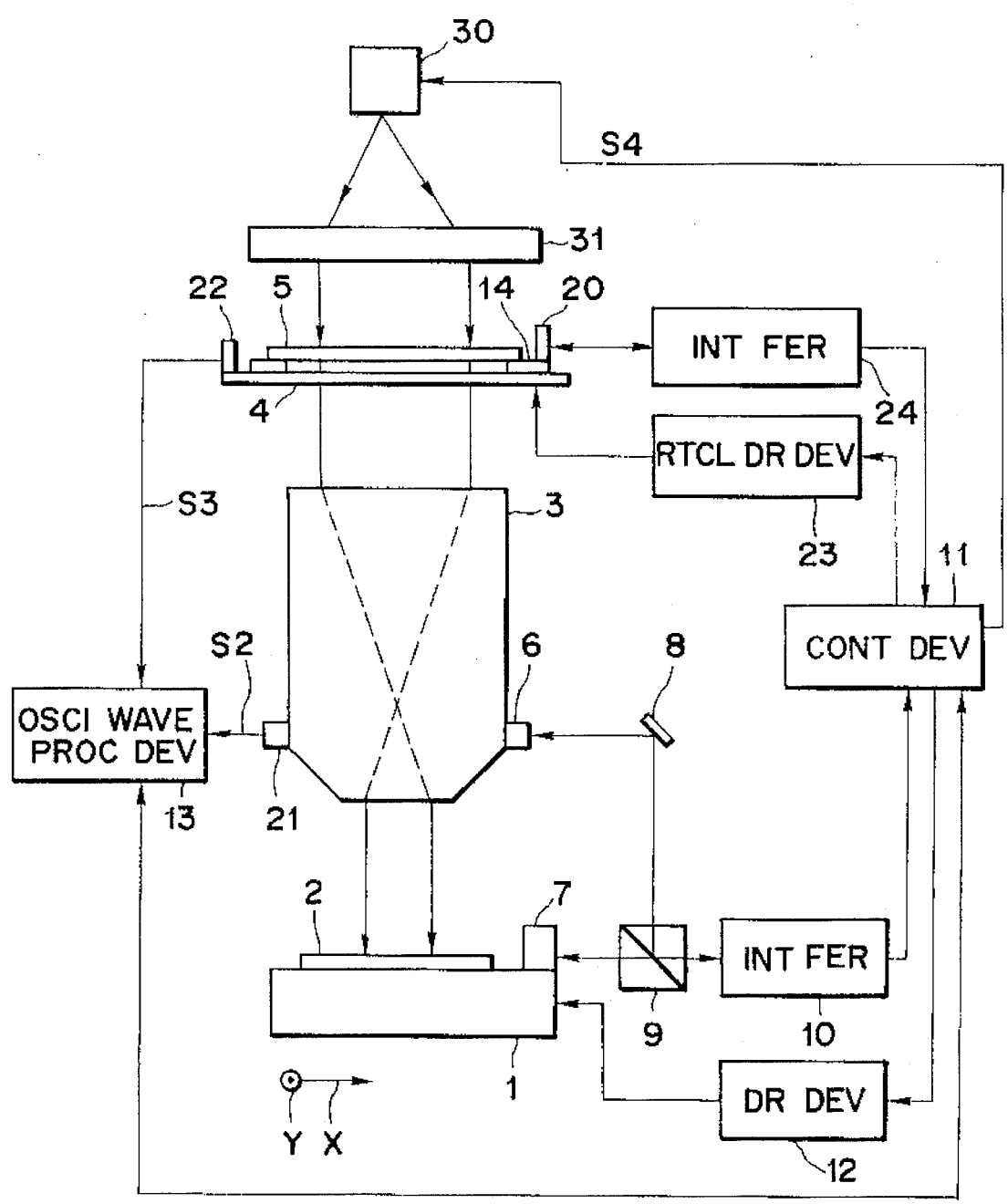
FIG. 1 shows an overall configuration of one embodiment of a projection exposure apparatus of the present invention.

One embodiment of the present invention will now be explained in detail with reference to the drawing. FIG. 1 shows a projection exposure apparatus of the present invention in which illumination light emitted from an exposure device 30 which includes a shutter for controlling transmission and blocking of the illumination light illuminates a reticle 5 held on a reticle holder 14 with a substantially uniform illumination through an illumination optical system 31.

In FIG. 1, like elements to those shown in FIG. 4 are designated by like numerals.

The exposure light transmitted through the reticle 5 is directed to a bi-telecentric (or mono-telecentric) projection lens 3, which focuses and projects a projection image of a circuit pattern formed on the reticle 5 onto a wafer 2 having a resist layer formed on a surface thereof.

The wafer 2 is mounted on a wafer stage 1 which is two-dimensionally driven in X and Y directions by a step-and-repeat method. When transfer exposure of the reticle 5 to one exposure area on the wafer 2 is completed, the wafer 2 is stepped to the next exposure position. The two-dimensional position of the wafer stage 1 is continuously detected by an interferometer 10 at a resolution of the order of 0.01 μm.

The exposure of the pattern is repeatedly done to the same wafer 2, which is then developed and etched so that reticle patterns are formed in a matrix on the wafer 2.

The reticle 5 held on the reticle support member 4 through a reticle holder 14 can be two-dimensionally driven in X and Y directions by a reticle drive unit (device) 23, and the two-dimensional position of the reticle 5 is always detected by an interferometer 24. A movable mirror 20 which reflects a laser beam from the interferometer 24 is attached to an end of the reticle holder 14.

The reticle drive system is light in weight, has a high controllability and is fully compatible to a fine movement because a magnification factor of the wafer 2 to the reticle 5 is usually 1/N (N≧5).

A vibration sensor 22 is mounted at an end of the reticle support member 4, and a vibration sensor 21 is mounted at substantially the same height level as the fixed mirror 6 which is fixed to a lens barrel of the projection lens 3. Information from the vibration sensors 21 and 22 is supplied to a vibration waveform processing unit (device) 13 which continuously detects a vibration status around the wafer stage 1 (around the fixed mirror 6) and a vibration status around the reticle 5.

The control unit (device) 11 issues a drive command to the drive units 12 and 23 in accordance with the position measurement signals from the interferometers 10 and 24, and controls the movement and the positioning of the wafer stage 1 and the reticle 5. The control unit 11 further controls an exposure device 30 in accordance with the information from the vibration waveform processing unit 13 to control the exposure operation. The exposure operation is controlled by controlling the opening and closing of a shutter in the exposure device 30.

An exposure operation when the wafer stage 1 is stepped under a condition (at a wafer stage position) in which the vibration of the wafer stage 1 is hard to be propagated to the reticle 5, is explained below.

FIG. 2(A) shows a speed signal S1 which represents a speed of the wafer stage 1 when the wafer stage 1 is driven. A pedestal-shaped rising portion of the signal level indicates the stepping of the wafer stage 1, and an area between pedestals indicates fine adjustment of the wafer stage 1.

FIG. 2(B) shows an output S2 of the vibration sensor 21, and FIG. 2(C) shows an output S3 of the vibration sensor 22. FIG. 2(B) indicates that the vibration in the stepping of the wafer stage 1 is well propagated to the vibration sensor 21 because the vibration sensor 21 is mounted closely to the wafer stage 1. On the other hand, FIG. 2(C) indicates that the vibration is not linearly propagated to the vibration sensor 22.

In the fine adjustment section of the wafer stage 1 between the pedestals of FIG. 2(A), when the wafer stage 1 is driven into a target exposure area (time t1, t2, t3 or t4), the vibration waveform processing unit 13 determines the vibration status of the vibration sensors 21 and 22. When the vibration waveform processing unit 13 determines that vibration is not detected, it sends an exposure command to the control unit 11, which, in response to the exposure command, sends an exposure signal S4 shown in FIG. 2(D) to the exposure device 30 to carry out the exposure operation.

Figure 2:
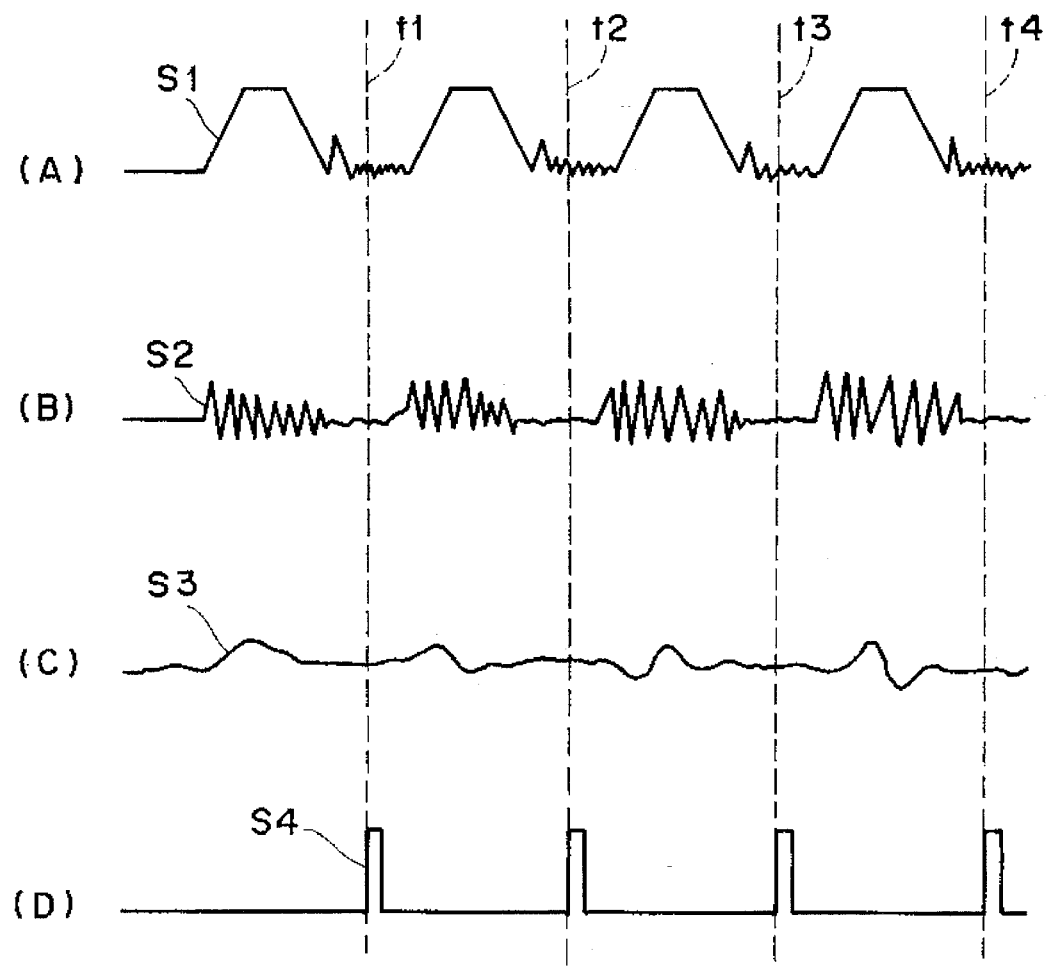
FIGS. 2(A–D) shows signal waveforms for an exposure operation when an equilibrium is maintained between a reticle and a wafer.

In FIG. 2, the condition is such that the vibration of the wafer stage 1 is hard to be propagated to the reticle 5. Thus, at the time t1, t2, t3 or t4 when the wafer stage 1 is driven into the target exposure area, the vibrations of the wafer stage 1 and the reticle 5 have been settled. Accordingly, the control unit 11 can carry out the exposure operation without controlling the exposure device in a special manner (that is, without delaying an exposure timing).

An exposure operation in a bad equilibrium of the wafer stage 1 and the reticle 5 is now explained.

Figure 3:
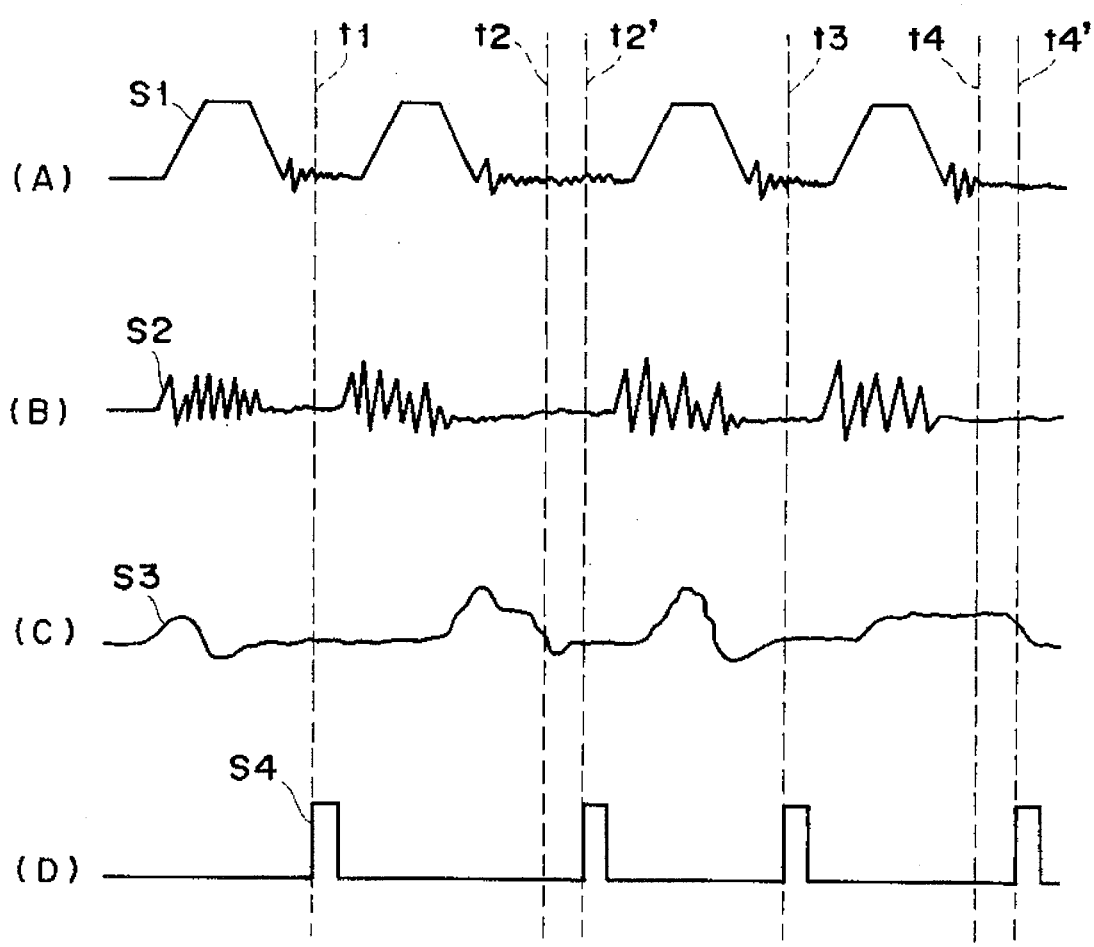
FIGS. 3(A–D) shows signal waveforms for an exposure operation when an equilibrium is not maintained between the reticle and the wafer.

In FIG. 3, the vibration is detected by the vibration sensor 22 even at a time t2 or t4 at which the speed signal S1 (FIG. 3(A)) of the wafer stage 1 is within a predetermined window (that is, the wafer stage 1 has been driven into the target exposure area). This is due to the bad equilibrium of the wafer stage 1 and the reticle 5. At the time point t2 or t4, the vibration at the stepping is propagated to the vicinity of the reticle 5 in delay, or the vibration of the reticle 5 continues.

In this case, the neighborhood of the reticle 5 vibrates in spite of the fact that the neighbourhood of the wafer stage 1 (neighbourhood of the fixed mirror 6) does not vibrate (or in spite of the fact that the output of the vibration sensor 21 is zero). Thus, there is a possibility of lateral shift or rotation error during the exposure. Accordingly, the vibration waveform processing unit 13 does not send the exposure command to the control unit 11 at the time point t2 or t4, but suspends until the output representing the vibration from the vibration sensor 22 reaches zero.

Thus, the exposure is not carried out at the time point t2 or t4, and when the output from the vibration sensor 22 reaches zero at a subsequent time point t2' or t4', the vibration waveform processing unit 13 sends the exposure command to the control unit 11, which sends the exposure signal S4 shown in FIG. 3(D) to the exposure device 30 in response to the exposure command to carry out the exposure.

Through the control to suppress the exposure until the outputs of the vibration sensors 21 and 22 reach zero even after the wafer stage 1 has been driven into the exposure area, the lateral shift or the rotation error during the exposure can be prevented. Since the output of the sensor 21 is zero when the output of the sensor 22 is zero, the exposure may be controlled based on only the output of the sensor 22, or it may be controlled based on both outputs of the sensor 21 and the sensor 22.

In this manner, problems in the exposure are prevented by controlling the exposure based on the vibration information from at least one of the vibration sensor 21 and the vibration sensor 22.

Further, problems in the exposure due to the vibration can also be prevented even for a first layer wafer which has no alignment mark thereon.

In the present embodiment, the exposure is suspended until the vibration ceases. Alternatively, a lateral shift and a rotation may be predicted from the vibrations detected by the vibration sensors 21 and 22, and the drive of at least one of the reticle support member 4 and the wafer stage 1 may be controlled based on the prediction.

For example, the wafer stage 1 is stepped to correspond to the wafers of a predetermined shot arrangement. The vibrations of the vibration sensor 21 and the vibration sensor 22 are detected.

A relation between the vibrations (magnitudes, phase differences of the vibration waves, etc.) from the vibration sensors, and a relative shift of the reticle and the wafer and a rotation when the vibration is zero is previously determined and stored in a memory in the vibration waveform processing unit 13.

In the exposure operation, the lateral shift and the rotation of the reticle are predicted based on the stored relation and the outputs from the sensors, and the control unit 11 controls the drive of at least one of the wafer stage 1 and the reticle support member 4 based on the prediction.

In this manner, the reduction of the throughput due to the waiting time until the cease of the vibration can be prevented.

In the present embodiment, it is assumed that the reticle 5 is vibrated by the stepping of the wafer stage 1. In a system in which the wafer stage is rotated around one point in the projection exposure apparatus, the information of the vibration sensors 21 and 22 may be analyzed to devise a condition to maintain the relative position of the reticle 5 and the wafer 2.

In the present embodiment, the vibration sensor 22 is mounted at one point. Alternatively, the vibration sensors 22 may be mounted at several points to measure a rotation component.

In the apparatus of the present type, the positional relation of the reticle 5 and the wafer stage 1 is normally fixed by servo control based on the position information from the interferometer 24. In detecting the vibration, it is desirable to stop the servo control of the position of the reticle 5 based on the position information from the interferometer 24. By doing so, only the vibration due to the movement of the wafer stage 1 can be precisely detected. The projection optical system may be a refraction system, a reflection system or a combination thereof.

What is claimed is:

1. A projection exposure apparatus for exposing a pattern on a mask onto a photo-sensitive substrate through a projection optical system, comprising:

a light source for emitting exposure light;

a mask stage for holding said mask, said mask stage being disposed so that said mask receives said exposure light;

a device for driving said mask stage two-dimensionally;

a substrate stage for holding said photo-sensitive substrate, said substrate stage being disposed so that said substrate receives exposure light from said mask through said projection optical system;

a device for driving said substrate stage stepwise two-dimensionally;

a first vibration detection sensor disposed for detecting vibration of said mask to generate a first detection output;

a second vibration detection sensor disposed for detecting vibration of said projection optical system to generate a second detection output; and means connected to said sensors and connected to at least one of said driving devices of said mask stage and said substrate stage for controlling driving of at least one of said mask stage and said substrate stage in accordance with at least said first and second detection outputs.

2. A projection exposure apparatus according to claim 1, wherein said means controls driving of at least one of said mask stage and said substrate stage so that a relative position between said mask and said photo-sensitive substrate is maintained.

3. A projection exposure apparatus according to claim 1, wherein said means determines relative lateral shift and rotation of said mask and said substrate for also controlling driving of at least one of said mask stage and said substrate stage in accordance with the determined lateral shift and rotation of said mask and said substrate.

4. A projection exposure apparatus according to claim 1, wherein said means includes a memory for memorizing information regarding relative lateral shift and rotation of said mask and said substrate for controlling driving of at least one of said mask stage and said substrate stage based on information memorized in said memory and said first and second detection outputs.

5. A projection exposure apparatus for exposing a pattern on a mask onto a photo-sensitive substrate through a projection optical system, comprising:

a light source for emitting exposure light;

a mask stage for holding said mask, said mask stage being disposed so that said mask receives said exposure light;

a device for driving said mask stage two-dimensionally;

a substrate stage for holding said substrate, said substrate stage being disposed so that said substrate receives exposure light from said mask through said projection optical system;

a device for driving said substrate stage stepwise two-dimensionally;

a vibration detection sensor disposed for detecting vibration of said mask to generate a detection output; and means connected to said sensor and connected to at least one of said driving devices of said mask stage and said substrate stage for controlling driving of at least one of said mask stage and said substrate stage in accordance with at least the detection output from said vibration detection sensor.

6. A projection exposure apparatus according to claim 5, wherein said means controls driving of at least one of said mask stage and said substrate stage so that a relative position between said mask and said photo-sensitive substrate is maintained.

7. A projection exposure apparatus according to claim 5, wherein said means determines relative lateral shift and rotation of said mask and said substrate for also controlling driving of at least one of said mask stage and said substrate stage in accordance with the determined lateral shift and rotation of said mask and said substrate.

8. A projection exposure apparatus according to claim 5, wherein said means includes a memory for memorizing information regarding relative lateral shift and rotation of said mask and said substrate for controlling driving of at least one of said mask stage and said substrate stage based on information memorized in said memory and at least said detection output.

9. In an exposure method in which a pattern on a mask is exposed onto a photo-sensitive substrate through a projection optical system, the steps of:

detecting vibration of said mask; and moving at least one of said mask and said substrate in accordance with at least the detected vibration so that a relative relation between said mask and said substrate is maintained while the pattern is projected onto the mask.

* * * * *